United States Patent
Feng

(10) Patent No.: US 10,714,545 B2
(45) Date of Patent: Jul. 14, 2020

(54) METHOD FOR MANUFACTURING TOUCH CONTROL DISPLAY SCREEN

(71) Applicant: Wuhan China Star Optoelectronics Semiconductor Display Technology Co., Ltd., Wuhan (CN)

(72) Inventor: Xiaoliang Feng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 36 days.

(21) Appl. No.: 16/092,444

(22) PCT Filed: Aug. 8, 2018

(86) PCT No.: PCT/CN2018/099395
§ 371 (c)(1),
(2) Date: Oct. 10, 2018

(87) PCT Pub. No.: WO2019/227668
PCT Pub. Date: Dec. 5, 2019

(65) Prior Publication Data
US 2019/0363137 A1    Nov. 28, 2019

(51) Int. Cl.
| | |
|---|---|
| *H01L 27/32* | (2006.01) |
| *H01L 51/00* | (2006.01) |
| *H01L 51/52* | (2006.01) |
| *H01L 51/56* | (2006.01) |
| *G06F 3/044* | (2006.01) |
| *G03F 1/38* | (2012.01) |
| *G03F 7/16* | (2006.01) |
| *G03F 7/20* | (2006.01) |
| *G03F 7/26* | (2006.01) |

(52) U.S. Cl.
CPC ............ *H01L 27/323* (2013.01); *G06F 3/044* (2013.01); *H01L 27/3244* (2013.01); *H01L 51/0018* (2013.01); *H01L 51/0097* (2013.01); *H01L 51/5253* (2013.01); *H01L 51/56* (2013.01); *G03F 1/38* (2013.01); *G03F 7/16* (2013.01); *G03F 7/2022* (2013.01); *G03F 7/26* (2013.01); *G06F 2203/04103* (2013.01); *G06F 2203/04111* (2013.01); *H01L 2227/323* (2013.01); *H01L 2251/5338* (2013.01)

(58) Field of Classification Search
CPC ............... H01L 27/3244; H01L 27/323; H01L 51/0097; H01L 51/5253; H01L 51/56
USPC ........................................ 216/13, 18, 24, 47
See application file for complete search history.

(56) References Cited

U.S. PATENT DOCUMENTS

2018/0143721 A1 * 5/2018 Matsueda .............. G06F 3/0412
2019/0165327 A1 * 5/2019 Ye .......................... H01L 27/323

* cited by examiner

Primary Examiner — Binh X Tran

(57) ABSTRACT

A method for manufacturing a touch control display screen is provided. The method includes sequentially forming a thin film transistor layer, an OLED display layer, and a thin film encapsulation layer on a substrate; sequentially forming a first insulation layer, a bridge layer, a second insulation layer, a touch control electrode layer, and a protection layer on the thin film encapsulation layer; and using a multi-transmittance mask plate to perform a mask process for the first insulation layer and the second insulation layer, so as to pattern the first insulation layer and the second insulation layer.

7 Claims, 4 Drawing Sheets

METHOD FOR MANUFACTURING TOUCH CONTROL DISPLAY SCREEN

RELATED APPLICATIONS

This application is a National Phase of PCT Patent Application No. PCT/CN2018/099395 having International filing date of Aug. 8, 2018, which claims the benefit of priority of Chinese Patent Application No. 201810519583.7 filed on May 28, 2018. The contents of the above applications are all incorporated by reference as if fully set forth herein in their entirety.

FIELD AND BACKGROUND OF THE INVENTION

The present disclosure relates to the field of manufacturing display panels, and more particularly to a method for manufacturing a touch control display screen.

Among various types of flat panels, organic light emitting diode (OLED) displays have outstanding properties, including being thinner, more energy-saving, and wider viewing angles, when compared to liquid crystal displays (LCDs). As display technology is rapidly developed, touch control display screens haven been widely used in people's lives.

Current touch control technology can be generally classified into an out-cell touch control technology and an in-cell touch control technology. The in-cell touch control technology is characterized by integrating touch sensors inside the display panels. Because the in-cell touch control technology, compared to the out-cell touch control technology, enables display apparatuses to have relatively lighter weight and be thinner, manufacturers of the OLED display apparatuses are directing their attention toward application of in-cell touch control technology in OLED displays. In contrast, the out-cell touch control technology is characterized by embedding a touch screen between a color filter substrate and a polarizer of the display screen (i.e., disposing the touch sensor on the liquid crystal display panel). Thus, the degree of technical difficulty for the out-cell touch control technology is quite lowered in comparison to that for the in-cell touch control technology.

In a conventional method for manufacturing the out-cell OLED touch control display screen, a touch control layer is generally formed on an OLED encapsulation layer. The touch control layer includes a first insulation layer, a bridge layer, a second insulation layer, a touch control electrode layer, and a protection layer sequentially formed on the OLED encapsulation layer. According to the conventional method, the formation of the touch control device on the OLED, particularly the formation of the touch control device on the flexible OLED encapsulation layer, requires five mask processes, and each mask process includes a film deposition, an exposure treatment, a development treatment, an etching treatment, a stripping treatment, and a rinse treatment between these steps.

Therefore, according to the conventional method for manufacturing the touch control display screen, too many mask processes are needed to form the touch control layer, thus increasing manufacturing cost and decreasing manufacturing efficiency.

SUMMARY OF THE INVENTION

The present disclosure provides a method for manufacturing a touch control display screen which solves the problems encountered by the prior art, where too many mask plates are required for manufacturing the same, decreasing manufacturing efficiency.

To solve the aforementioned problems, the present disclosure provides the following technical schemes.

The present disclosure provides a method for manufacturing a touch control display screen, comprising:

a step S20 of forming a first insulation layer on a thin film encapsulation layer;

a step S30 of forming a bridge layer on the first insulation layer;

a step S40 of forming a second insulation layer on the bridge layer;

a step S50 of using a mask to perform a mask process on the second insulation layer, so as to pattern the first insulation layer and the second insulation layer, and to form a first contact hole in the second insulation layer;

a step S60 of forming a touch control electrode layer on the second insulation layer; and a step S70 of forming a protection layer on the touch control electrode layer.

In one preferred embodiment of the present disclosure, before the step S20, the method further comprises:

a step S10 of providing a substrate, and sequentially forming a thin film transistor layer, an organic light emitting diode (OLED) display layer, and the thin film encapsulation layer on the substrate, wherein the thin film transistor layer includes a touch control lead.

In one preferred embodiment of the present disclosure, the touch control display screen includes a first display area and a second display area.

In one preferred embodiment of the present disclosure, the step S50 includes:

a step S51 of coating a photoresist on a surface of the second insulation layer;

a step S52 of using a multi-transmittance mask plate to perform an exposure treatment on the photoresist, and performing a development treatment on the photoresist, such that the photoresist is patterned to generate a first development region and a second development region that are spaced apart from each other, wherein the first development region is in the first display area, and the second development region is in the second display area;

a step S53 of performing an etching treatment for the second development region, such that a combined thickness of the first insulation layer and the second insulation layer in the second development region is equal to a thickness of the second insulation layer in the first development region;

a step S54 of performing an ashing treatment on the photoresist to remove the photoresist in the first development region and to reduce a thickness of the photoresist that is not exposed;

a step S55 of performing an etching treatment for the first development region and the second development region, such that the first insulation layer and the second insulation layer are patterned, and the first contact hole is formed in the second insulation layer; and a step S56 of removing the photoresist.

In one preferred embodiment of the present disclosure, the multi-transmittance mask plate includes a first transmittance region and a second transmittance region, wherein the first transmittance region corresponds to the first development region, and the second transmittance region corresponds to the second development region.

In one preferred embodiment of the present disclosure, a transmittance of the first transmittance region is smaller than a transmittance of the second transmittance region.

In one preferred embodiment of the present disclosure, the first transmittance region is a half-exposure region, and the second transmittance region is a complete-exposure region.

In one preferred embodiment of the present disclosure, the step of forming the bridge layer and the step of forming the touch control electrode layer are exchanged with each other, wherein the bridge layer and the touch control electrode layer are made of indium tin oxide (ITO), metal, or graphene.

In one preferred embodiment of the present disclosure, the step S60 includes:

a step S61 of forming the touch control electrode layer on the second insulation layer;

a step S62 of coating the photoresist on the second insulation layer;

a step S63 of performing an exposure treatment and a development treatment on the photoresist, so as to pattern the photoresist;

a step S64 of performing an etching treatment on the touch control electrode layer, so as to form a second contact hole in the touch control electrode layer; and a step S65 of removing the photoresist.

In one preferred embodiment of the present disclosure, the protection layer is made of an inorganic insulation material or an organic insulation material. Under the circumstance that the protection layer is made of an organic insulation material, it could be formed by using photolithography technique only.

The present disclosure provides a method for manufacturing a touch control display screen According to the present disclosure, the first insulation layer and the second insulation layer are formed using a same mask process, and two etching treatments are performed in sequence on the insulation layers to pattern the first insulation layer and the second insulation layer, therefore quantity of mask plates used for manufacturing the touch control display screen is reduced, increasing manufacturing efficiency and decreasing manufacturing cost. In addition, because quantity of mask plates is reduced, the likelihood that the touch control lead, which is connected to the touch control layer, might be oxidized due to long time exposure to atmosphere can be reduced.

BRIEF DESCRIPTION OF THE SEVERAL VIEWS OF THE DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

FIG. 5 is a schematic diagram showing a cross-sectional view of a structure of a touch control display screen according to one preferred embodiment of the present disclosure.

DESCRIPTION OF SPECIFIC EMBODIMENTS OF THE INVENTION

Figure 1:
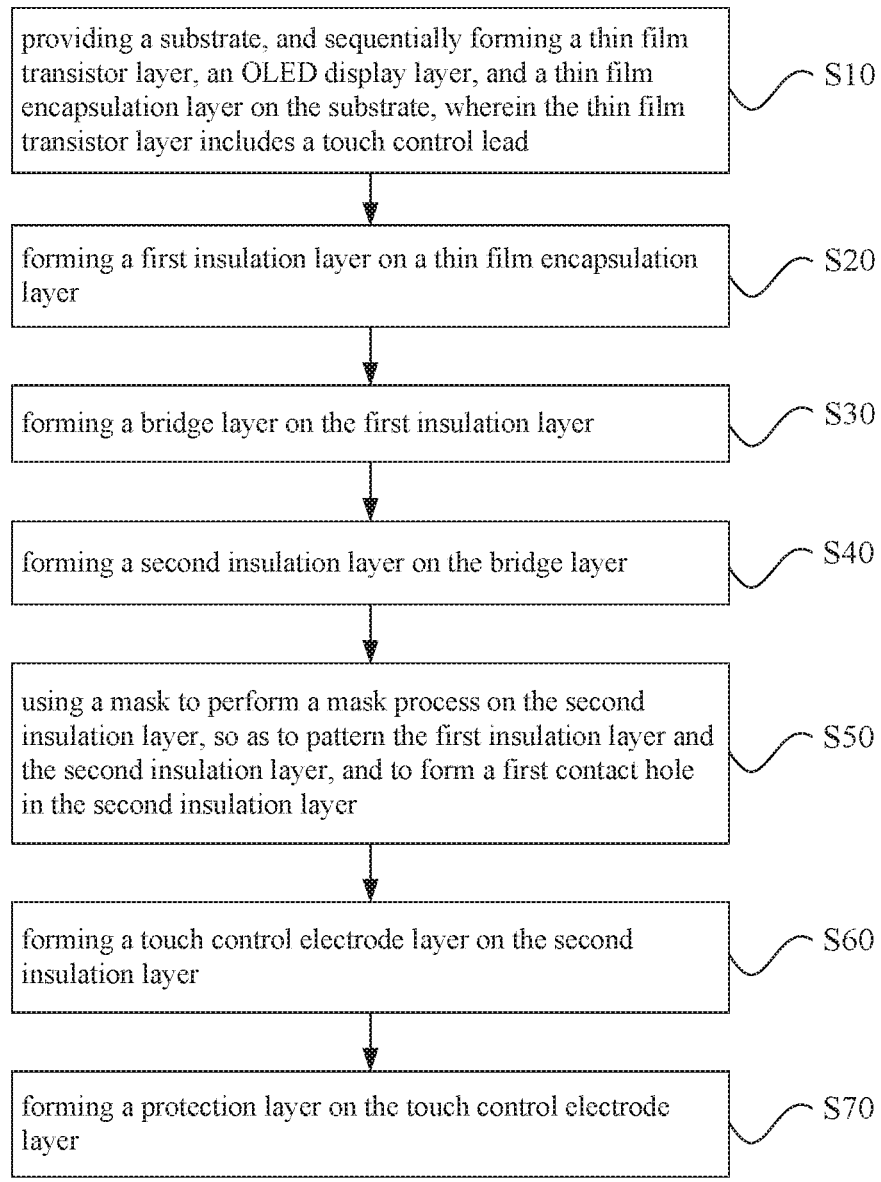
FIG. 1 shows a flowchart of a method for manufacturing a touch control display screen according to one preferred embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure provides a method for manufacturing a touch control display screen which solves the problems encountered by the prior art, where too many mask plates are required for manufacturing the same, increasing manufacturing cost and decreasing manufacturing efficiency.

Please refer to FIG. 1, which shows a flowchart of a method for manufacturing a touch control display screen. The method includes the following steps.

In a step S10, a substrate is provided, and a thin film transistor layer 102, an organic light emitting diode (OLED) display layer 103, and a thin film encapsulation layer 104 are sequentially formed on the substrate 101. The thin film transistor layer 102 includes a touch control lead 1021 and a binding pad.

Figure 2:
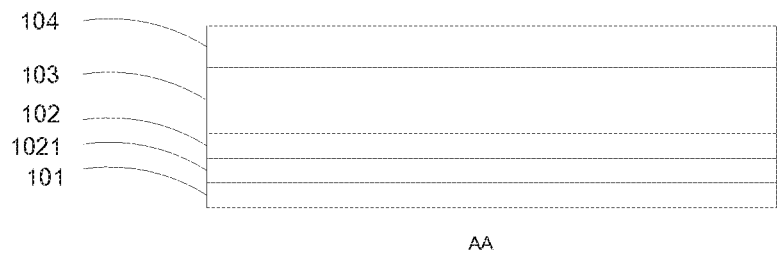
FIGS. 2, 3, 4A, 4B, 4C, 4D, 4E, and 5 are schematic diagrams showing different stages of the process of a method for manufacturing the touch control display screen according to one preferred embodiment of the present disclosure.
Figure 3:
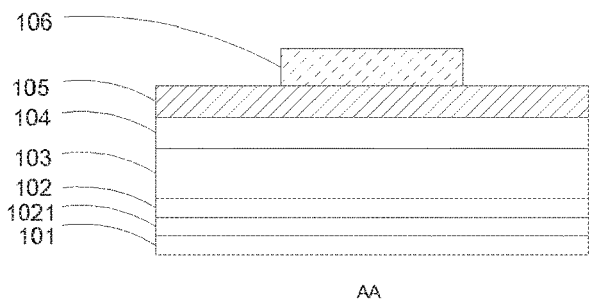

Specifically, as shown in FIG. 2, the flexible substrate 101 is provided, and the flexible substrate 101 is made of a polyimide film. The flexible substrate 101 is used as a base plate of the display panel.

The polyimide film has a high tensile strength, and is one of the best insulating materials in the world. The polyimide film is formed by condensation polymerization of pyromellitic dianhydride and diaminodiphenyl ether in a strong polar solvent, which is then casted to form a film and is further imidized.

The thin film transistor layer 102, the OLED display layer 103, and the thin film encapsulation layer 104 are sequentially formed on the flexible substrate 101.

Herein, the thin film transistor layer 102 includes the touch control lead 1021 and the binding pad. The thin film transistor layer 102 includes a buffer layer, an active layer, a gate insulation layer, a gate electrode layer, an inter-layer insulation layer, a source/drain electrode layer, and a planarization layer.

The OLED display layer 103 includes an anode layer, a hole injection layer, a hole transport layer, a light-emitting layer, an electron transport layer, an electron injection layer, and a cathode layer.

The thin film encapsulation layer 104 includes one organic encapsulation layer and two inorganic encapsulation layers. The organic encapsulation layer is sandwiched between the two inorganic encapsulation layers. The thin film encapsulation layer 104 functions to block exterior water and oxygen from contacting and eroding the organic light-emitting layer.

In a step S20, a first insulation layer 105 is formed on the thin film encapsulation layer 104.

Specifically, the first insulation layer 105 is deposited on the thin film encapsulation layer 104 by a chemical technique, such that the first insulation layer 105 completely covers the OLED display layer 103 and the thin film encapsulation layer 104. In the present embodiment, the first insulation layer 105 could be made of silicon nitride, or made of silicon oxide or silicon oxynitride. The first insulation layer 105 functions to protect OLED display area from being damaged by exterior water and oxygen and moisture.

In a step S30, a bridge layer 106 is formed on the first insulation layer 105.

Specifically, a first thin film is deposited on the first insulation layer 105 first. In the present embodiment, the first thin film could be made of aluminum, titanium, silver, or copper, or could have a combined structure consisted of these metals. The first thin film could be made of a transparent material, such as indium tin oxide (ITO) or graphene, as well.

Then, a first photoresist is coated on a surface of the first thin film. A first mask is used, and an exposure treatment, a development treatment, an etching treatment, and a stripping treatment are performed to pattern the first thin film, so as to form the bridge layer 106 on a surface of the first insulation layer 105.

In a step S40, a second insulation layer 107 is formed on the bridge layer 106.

Figure 4A:
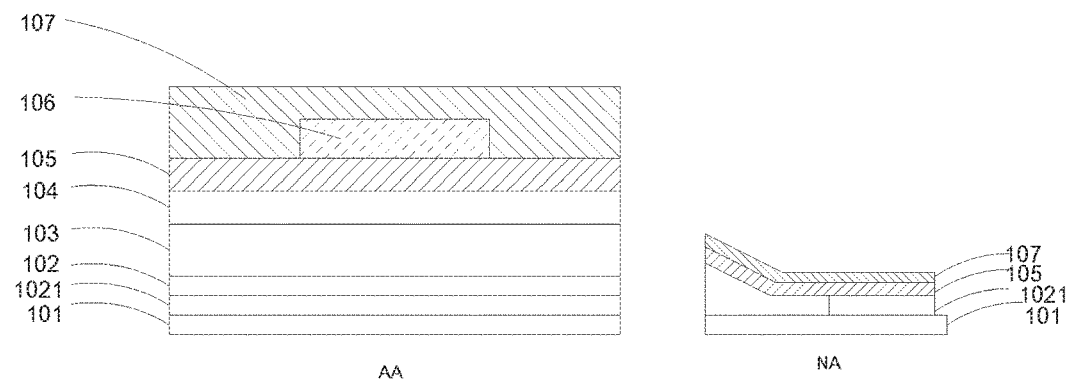

Specifically, as shown in FIG. 4A, the second insulation layer 107 is deposited on the bridge layer 106. In the present embodiment, the second insulation layer 107 is made of silicon nitride.

In a step S50, a mask is used to perform a mask process on the second insulation layer 107, so as to pattern the first insulation layer 105 and the second insulation layer 107, and to form a first contact hole 1071 in the second insulation layer 107.

The touch control display screen includes a first display area AA and a second display area NA. One etching treatment is performed on the insulation layer of the area AA, and two etching treatments are performed on the insulation layer of the area NA.

Figure 4B:
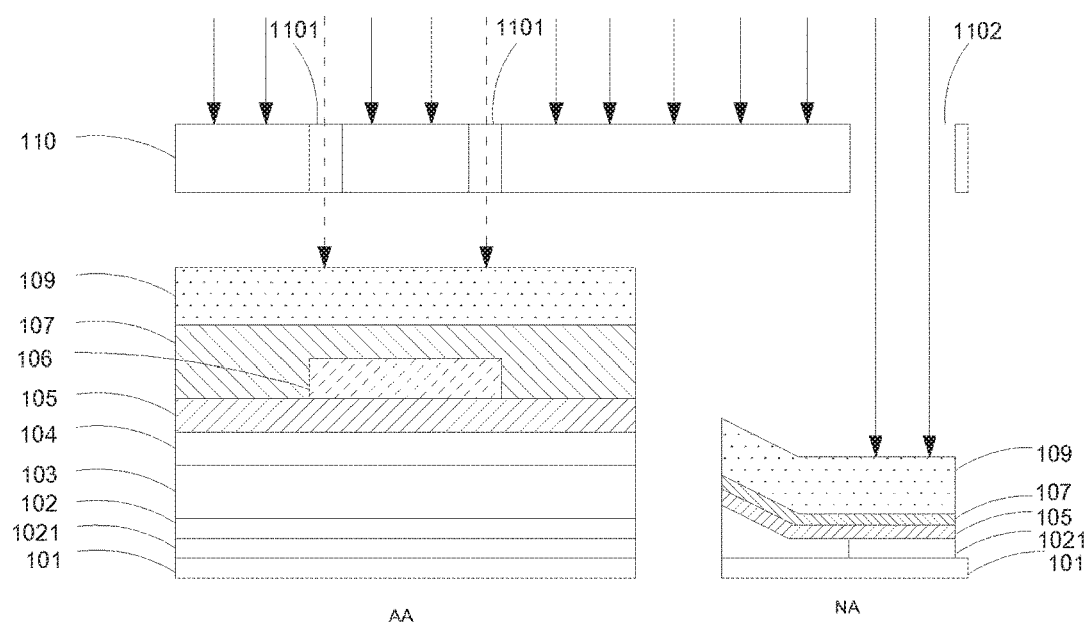

Specifically, as shown in FIG. 4B, a second photoresist 109 is coated on a surface of the second insulation layer 107.

Figure 4C:
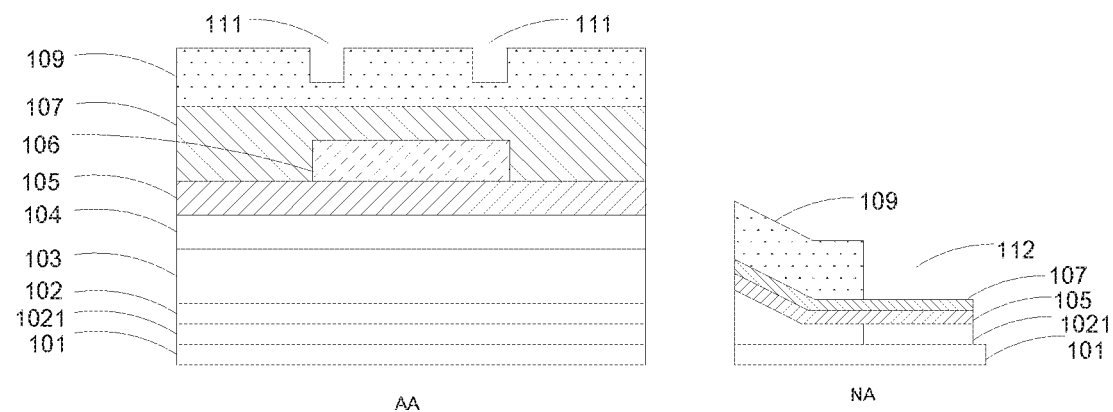

Next, a multi-transmittance mask plate 110 is used to perform an exposure treatment on the second photoresist 109. After being developed, the second photoresist is patterned to generate a first development region 111 and a second development region 112 that are spaced apart from each other, as shown in FIG. 4C.

Herein, the first development region 111 is in the first display area AA, and the second development region 112 is in the second display area NA.

The multi-transmittance mask plate 110 includes a first transmittance region 1101 and a second transmittance region 1102, wherein the first transmittance region 1101 corresponds to the first development region 111, and the second transmittance region 1102 corresponds to the second development region 112.

A transmittance of the first transmittance region 1101 is smaller than a transmittance of the second transmittance region 1102. Preferably, the first transmittance region 1101 is a half-exposure region, and the second transmittance region 1102 is a complete-exposure region.

Then, an etching treatment is performed for the second development region 112 (i.e., an etching treatment is performed on the second insulation layer 107 in the second display area NA), such that a combined thickness of the first insulation layer 105 and the second insulation layer 107 in the second display area NA is equal to a thickness of the second insulation layer 107 in the first development region 111.

Figure 4D:
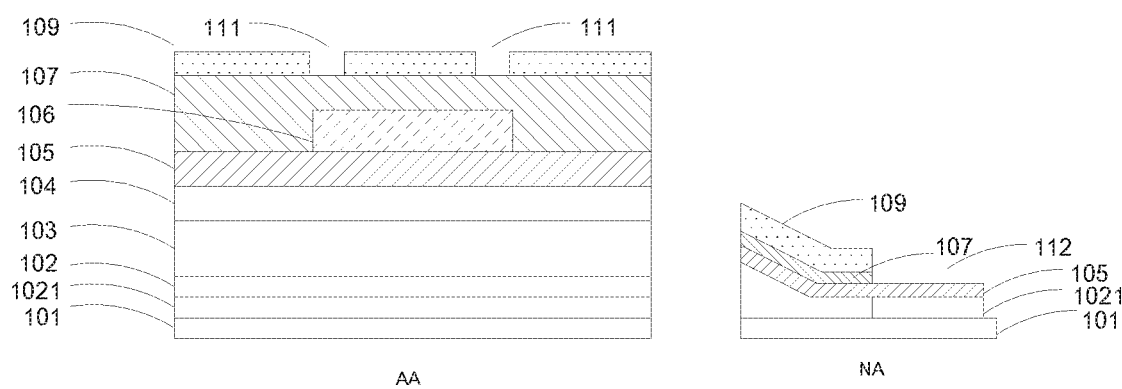

Thereafter, an ashing treatment is performed on the second photoresist 109 to remove the second photoresist 109 in the first development region 111 and to reduce a thickness of the second photoresist 109 that is not exposed to light, as shown in FIG. 4D.

Further, an etching treatment is performed for the first development region 111 and the second development region 112, such that the first insulation layer 105 and the second insulation layer 107 are patterned, and the first contact hole 1071 is formed in the second insulation layer 107.

Figure 4E:
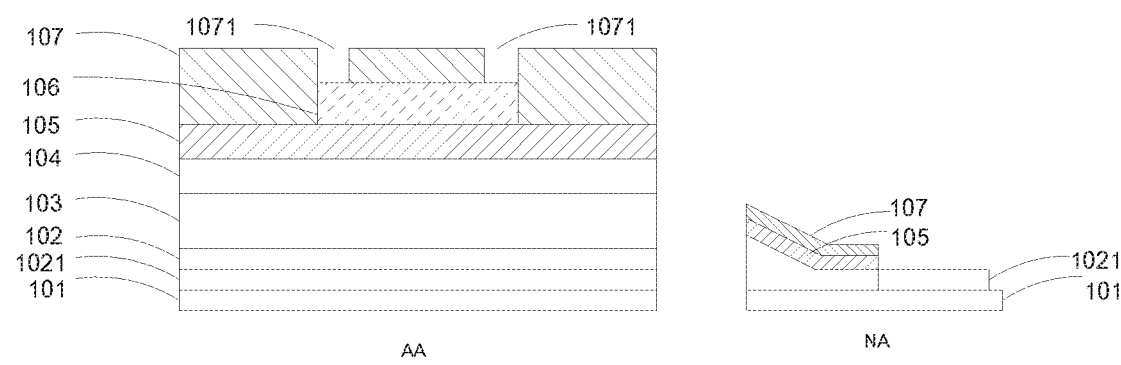

Finally, the second photoresist 109 is removed, as shown in FIG. 4E.

In a step S60, a touch control electrode layer 113 is formed on the second insulation layer 107.

Specifically, a second thin film is deposited on the second insulation layer 107 first. In the present embodiment, the second thin film could be made of aluminum, titanium, silver, or copper, or could have a combined structure consisted of these metals. The second thin film could be made of a transparent material, such as indium tin oxide (ITO) or graphene, as well.

Then, a third photoresist is coated on a surface of the second thin film.

Thereafter, an exposure treatment and a development treatment are performed on the third photoresist, so as to pattern the third photoresist.

Further, an etching treatment is performed on the second thin film, so as to form the touch control electrode layer 113, and to form a second contact hole 1131 in the touch control electrode layer 113.

Finally, the third photoresist is removed.

Herein, the touch control electrode layer 113 includes a touch control driving electrode and a touch control sensing electrode, and the bridge layer 106 connects the touch control driving electrode to the touch control sensing electrode via the first contact hole 1071.

In the area NA, the touch control electrode layer 113 contacts and is connected to the touch control lead 1021.

In a step S70, a protection layer 114 is formed on the touch control electrode layer 113.

Specifically, the protection layer 114 is deposited on a surface of the touch control electrode layer 113 first. The protection layer 114 is made of an inorganic insulation material or an organic insulation material.

Figure 5:
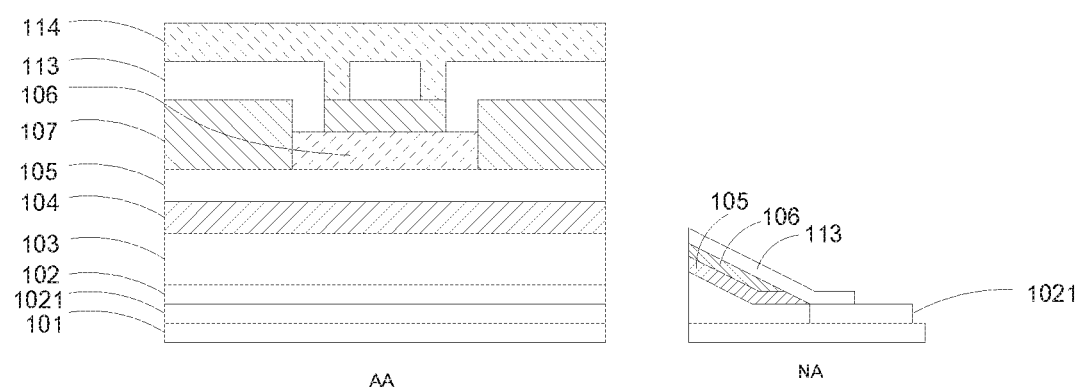

Next, a fourth photoresist is coated on a surface of the protection layer 114. A second mask plate is used, and an exposure treatment, a development treatment, an etching treatment, and a stripping treatment are performed to pattern the protection layer 114, as shown in FIG. 5.

The protection layer 114 functions to protect the touch control electrode layer 113.

In the present embodiment, the step of forming the bridge layer 106 and the step of forming the touch control electrode layer 113 could be exchanged with each other. This does not affect the manufacturing effect.

The present disclosure provides a method for manufacturing a touch control display screen According to the present disclosure, the first insulation layer and the second insulation layer are formed using a same mask process, and two etching treatments are performed in sequence on the insulation layers to pattern the first insulation layer and the second insulation layer, therefore quantity of mask plates used for manufacturing the touch control display screen is reduced, increasing manufacturing efficiency and decreasing manufacturing cost. In addition, because quantity of mask plates is reduced, the likelihood that the touch control lead, which is connected to the touch control layer, might be oxidized due to long time exposure to atmosphere can be reduced While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a touch control display screen, comprising:
    a step S20 of forming a first insulation layer on a thin film encapsulation layer;
    a step S30 of forming a bridge layer on the first insulation layer;
    s step S40 of forming a second insulation layer on the bridge layer;
    a step S50 of using a mask to perform a mask process on the second insulation layer, so as to pattern the first insulation layer and the second insulation layer, and to form a first contact hole in the second insulation layer;
    a step S60 of forming a touch control electrode layer on the second insulation layer; and
    a step S70 of forming a protection layer on the touch control electrode layer,
    wherein the thin film encapsulation layer includes one organic encapsulation layer and two inorganic encapsulation layers, the touch control display screen includes a first display area and a second display area, and the step S50 includes:
        a step S51 of coating a photoresist on a surface of the second insulation layer;
        a step S52 of using a multi-transmittance mask plate to perform an exposure treatment on the photoresist, and performing a development treatment on the photoresist, such that the photoresist is patterned to generate a first development region and a second development region that are spaced apart from each other,
        wherein the first development region is in the first display area, and the second development region is in the second display area;
        a step S53 of performing an etching treatment for the second development region, such that a combined thickness of the first insulation layer and the second insulation layer in the second development region is equal to a thickness of the second insulation layer in the first development region;
        a step S54 of performing an ashing treatment on the photoresist to remove the photoresist in the first development region and to reduce a thickness of the photoresist that is not exposed;
        a step S55 of performing an etching treatment for the first development region and the second development region, such that the first insulation layer and the second insulation layer are patterned, and the first contact hole is formed in the second insulation layer; and
        a step S56 of removing the photoresist.

2. The method for manufacturing the touch control display screen according to claim 1, wherein before the step S20, the method further comprises:
    a step S10 of providing a substrate, and sequentially forming a thin film transistor layer, an organic light emitting diode (OLED) display layer, and the thin film encapsulation layer on the substrate.

3. The method for manufacturing the touch control display screen according to claim 1, wherein the step S60 includes:
    a step S61 of forming the touch control electrode layer on the second insulation layer;
    a step S62 of coating the photoresist on the second insulation layer;
    a step S63 of performing an exposure treatment and a development treatment on the photoresist, so as to pattern the photoresist;
    a step S64 of performing an etching treatment on the touch control electrode layer, so as to form a second contact hole in the touch control electrode layer; and
    a step S65 of removing the photoresist.

4. The method for manufacturing the touch control display screen according to claim 1, wherein the protection layer is made of an inorganic insulation material or an organic insulation material.

5. The method for manufacturing the touch control display screen according to claim 1, wherein the multi-transmittance mask plate includes a first transmittance region and a second transmittance region,
    wherein the first transmittance region corresponds to the first development region, and the second transmittance region corresponds to the second development region.

6. The method for manufacturing the touch control display screen according to claim 5, wherein a transmittance of the first transmittance region is smaller than a transmittance of the second transmittance region.

7. The method for manufacturing the touch control display screen according to claim 6, wherein the first transmittance region is a half-exposure region, and the second transmittance region is a complete-exposure region.

* * * * *

UNITED STATES PATENT AND TRADEMARK OFFICE
CERTIFICATE OF CORRECTION

PATENT NO. : 10,714,545 B2  
APPLICATION NO. : 16/092444  
DATED : July 14, 2020  
INVENTOR(S) : Xiaoliang Feng Page 1 of 1

It is certified that error appears in the above-identified patent and that said Letters Patent is hereby corrected as shown below:

On the Title Page

Insert Item (30):  
-- May 28, 2018 (CN)................. 201810519583.7 --

Signed and Sealed this  
Fifteenth Day of September, 2020

Andrei Iancu  
*Director of the United States Patent and Trademark Office*